United States Patent
Delshadpour et al.

(10) Patent No.: US 11,573,268 B1
(45) Date of Patent: Feb. 7, 2023

(54) SKEW DETECTION SYSTEM AND METHOD TO REMOVE UNWANTED NOISE DUE TO SKEWED SIGNALS

(71) Applicant: NXP USA, Inc., Austin, TX (US)

(72) Inventors: Siamak Delshadpour, Phoenix, AZ (US); Xu Zhang, Chandler, AZ (US); Xiaoqun Liu, Chandler, AZ (US); Kenneth Jaramillo, Gilbert, AZ (US)

(73) Assignee: NXP USA, Inc., Eindhoven (NL)

( * ) Notice: Subject to any disclaimer, the term of this patent is extended or adjusted under 35 U.S.C. 154(b) by 0 days.

(21) Appl. No.: 17/474,209

(22) Filed: Sep. 14, 2021

(51) Int. Cl.
*H03K 19/094* (2006.01)
*G01R 31/317* (2006.01)
*H03K 19/20* (2006.01)
*H03K 19/0185* (2006.01)

(52) U.S. Cl.
CPC ............ *G01R 31/31725* (2013.01); *H03K 19/018521* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 7,268,588 B2 * | 9/2007 | Sanchez | ........... | H03K 3/356113 326/86 |
| 7,893,724 B2 | 2/2011 | Moyal et al. | | |
| 8,427,798 B2 * | 4/2013 | Shimomura | ........... | H02H 9/046 361/56 |
| 10,848,297 B1 * | 11/2020 | Ribeiro | ........... | H03K 3/037 |
| 2021/0203473 A1 * | 7/2021 | Basil | ........... | H03L 7/0807 |

OTHER PUBLICATIONS

Lin, Zhihong, Texas Instruments; "Understanding the embedded USB2 (eUSB2) standard"; retrieved from the Internet https://e2e.ti.com/blogs_/b/analogwire/posts/understanding-embedded-usb2-eusb2; 3 pages (Aug. 19, 2019).

Zheng, Yuxiang et al; "A 5 GB/s Automatic Within-Pair Skew Compensator for Differential Data in 0.12 um CMOS" IEEE Trans. on Circuits and Systems-1: Regular Papers, vol. 58, No. 6; 12 pages (Jun. 2011).

Zheng, Yuxiang et al; "A 5 Gb/s Automatic Sub-Bit Between-Pair Skew Compensator for Parallel Data Communications in 0.13-um CMOS"; IEEE Trans. on Very Large Scale Integration (VLSI) Systems, vol. 21, No. 12; 12 pages (Dec. 2013).

Saeki, Takanori et al.; "A Direct-Skew-Detect Synchronous Mirror Delay for Application-Specific Integrated Circuits"; IEEE J. of Solid-State Circuits, vol. 34, No. 3; 8 pages (Mar. 1999).

Ahmed, N. et al.; "Extending JTAG for Testing Signal Integrity in SoCs"; Proceedings of the IEEE Design, Automation and Test in Europe Conference & Exhibition; 6 pages (2003).

Delsadpour, Siamak et al; "A BMC Analog and Digital PY for USB Type-C Power Delivery"; 2019 IEEE Canadian Conference of Electrical and Computer Engineering; 4 pages (2019).

* cited by examiner

Primary Examiner — Kenneth B Wells

(57) ABSTRACT

Various embodiments relate to a skew detector circuit, including: a logic circuit having two inputs configured to generate a logic 1 output when the two inputs have a logic 0 value and generator a logic 0 output when the two input have a logic 1 value; a first level shifter configured to increase the output of the logic circuit to a higher voltage; a second level shifter configured to increase the output of the first level shifter to a higher voltage; and a voltage regulator configured to produce a first voltage for the logic circuit, a second voltage for the first level shifter, and a third voltage for the second level shift.

12 Claims, 6 Drawing Sheets

SKEW DETECTION SYSTEM AND METHOD TO REMOVE UNWANTED NOISE DUE TO SKEWED SIGNALS

TECHNICAL FIELD

Various exemplary embodiments disclosed herein relate generally to a low area, low current, low complexity skew detector for eUSB/USB2 and other repeaters to remove unwanted high speed noise due to skewed low speed and full speed signals.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a skew detector circuit, including: a logic circuit having two inputs configured to generate a logic 1 output when the two inputs have a logic 0 value and generate a logic 0 output when the two input have a logic 1 value; a first level shifter configured to increase the output of the logic circuit to a higher voltage; a second level shifter configured to increase the output of the first level shifter to a higher voltage; and a voltage regulator configured to produce a first voltage for the logic circuit, a second voltage for the first level shifter, and a third voltage for the second level shifter.

Various embodiments are described, wherein the logic circuit includes: an output connected to a node; first and second PMOS transistors connected in series between a first voltage and the node; and first and second NMOS transistors connected in series between the node and a ground; wherein a first of the two inputs is connected to the gates of the second PMOS transistor and the first NMOS transistor, and wherein a second of the two inputs is connected to the gates of the first PMOS transistor and the second NMOS transistor.

Various embodiments are described, wherein the first level shifter includes a third PMOS transistor connected in series with a third NMOS transistor between the second voltage and a ground, wherein the gates of the third PMOS transistor and third NMOS transistor are connected to the output of the logic circuit; and the second level shifter includes a fourth PMOS transistor connected in series with a fourth NMOS transistor between the third voltage and the ground, wherein the gates of the fourth PMOS transistor and fourth NMOS transistor are connected to an output of the first level shifter.

Various embodiments are described, wherein the voltage regulator includes a first node configured to produce the first voltage and connected to a source voltage; a second node configured to produce the second voltage; a third node configured to produce the third voltage; a third NMOS transistor connected between the first and second nodes, wherein the gate of the third NMOS transistor is connected to the source voltage; a fourth NMOS transistor connected between the second and third nodes, wherein the gate of the fourth NMOS transistor is connected to the second node; and a resistor connected between the third node and a ground.

Various embodiments are described, including: a fifth NMOS transistor connected in series with the resistor between the third node and the ground, wherein the gate of the fifth NMOS transistor is connected to an enable signal configured to turn the voltage regulator on and off.

Further various embodiments relate to a high speed path enable circuit, including: a skew detector including: a logic circuit having two inputs configured to generate a logic 1 output when the two inputs have a logic 0 value and generate a logic 0 output when the two inputs have a logic 1 value; a first level shifter configured to increase the output of the logic circuit to a higher voltage; a second level shifter configured to increase the output of the first level shifter to a higher voltage; and a voltage regulator configured to produce a first voltage for the logic circuit, a second voltage for the first level shifter, and a third voltage for the second level shift; a squelch detector connected to the two inputs of the skew detector; and an AND gate configured to receive as inputs an output of the skew detection circuit and an output of the squelch circuit and to produce a high speed path enable signal.

Various embodiments are described, wherein the logic circuit includes: an output connected to a node; first and second PMOS transistors connected in series between a first voltage and the node; and first and second NMOS transistors connected in series between the node and a ground; wherein a first of the two inputs is connected to the gates of the second PMOS transistor and the first NMOS transistor, and wherein a second of the two inputs is connected to the gates of the first PMOS transistor and the second NMOS transistor.

Various embodiments are described, wherein the first level shifter includes a third PMOS transistor connected in series with a third NMOS transistor between the second voltage and a ground, wherein the gates of the third PMOS transistor and third NMOS transistor are connected to the output of the logic circuit; and the second level shifter includes a fourth PMOS transistor connected in series with a fourth NMOS transistor between the third voltage and the ground, wherein the gates of the fourth PMOS transistor and fourth NMOS transistor are connected to an output of the first level shifter.

Various embodiments are described, wherein the voltage regulator includes a first node configured to produce the first voltage and connected to a source voltage; a second node configured to produce the second voltage; a third node configured to produce the third voltage; a third NMOS transistor connected between the first and second nodes, wherein the gate of the third NMOS transistor is connected to the source voltage; a fourth NMOS transistor connected between the second and third nodes, wherein the gate of the fourth NMOS transistor is connected to the second node; and a resistor connected between the third node and a ground.

Various embodiments are described, including: a fifth NMOS transistor connected in series with the resistor between the third node and the ground, wherein the gate of the fifth NMOS transistor is connected to an enable signal configured to turn the voltage regulator on and off.

Various embodiments are described, further including a delay circuit connected between the output of the squelch detector and an input of the AND gate.

Further various embodiments relate to a repeater circuit, including: a high speed path in parallel with the low speed path connected between the differential inputs and the differential outputs; high speed path enable circuit configured to produce a high speed enable signal configured to control the high speed path, including: a skew detector including: a logic circuit having two inputs connected to the differential inputs configured to generate a logic 1 output when the two inputs have a logic 0 value and generate a logic 0 output when the two inputs have a logic 1 value; a first level shifter configured to increase the output of the logic circuit to a higher voltage; a second level shifter configured to increase the output of the first level shifter to a higher voltage; and a voltage regulator configured to produce a first voltage for the logic circuit, a second voltage for the first level shifter, and a third voltage for the second level shifter; a squelch detector with inputs connected to the differential inputs; and a NOR gate configured to receive as inputs an output of the skew detection circuit and an output of the squelch circuit and to produce the high speed path enable signal.

Various embodiments are described, wherein the logic circuit includes: an output connected to a node; first and second PMOS transistors connected in series between a first voltage and the node; and first and second NMOS transistors connected in series between the node and a ground; wherein a first of the two inputs is connected to the gates of the second PMOS transistor and the first NMOS transistor, and wherein a second of the two inputs is connected to the gates of the first PMOS transistor and the second NMOS transistor.

Various embodiments are described, wherein the first level shifter includes a third PMOS transistor connected in series with a third NMOS transistor between the second voltage and a ground, wherein the gates of the third PMOS transistor and third NMOS transistor are connected to the output of the logic circuit; and the second level shifter includes a fourth PMOS transistor connected in series with a fourth NMOS transistor between the third voltage and the ground, wherein the gates of the fourth PMOS transistor and fourth NMOS transistor are connected to an output of the first level shifter.

Various embodiments are described, wherein the voltage regulator includes a first node configured to produce the first voltage and connected to a source voltage; a second node configured to produce the second voltage; a third node configured to produce the third voltage; a third NMOS transistor connected between the first and second nodes, wherein the gate of the third NMOS transistor is connected to the source voltage; a fourth NMOS transistor connected between the second and third nodes, wherein the gate of the fourth NMOS transistor is connected to the second node; and a resistor connected between the third node and a ground.

Various embodiments are described, including: a fifth NMOS transistor connected in series with the resistor between the third node and the ground, wherein the gate of the fifth NMOS transistor is connected to an enable signal configured to turn the voltage regulator on and off.

Various embodiments are described, further including a delay circuit connected between the output of the squelch detector and an input of the AND gate.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
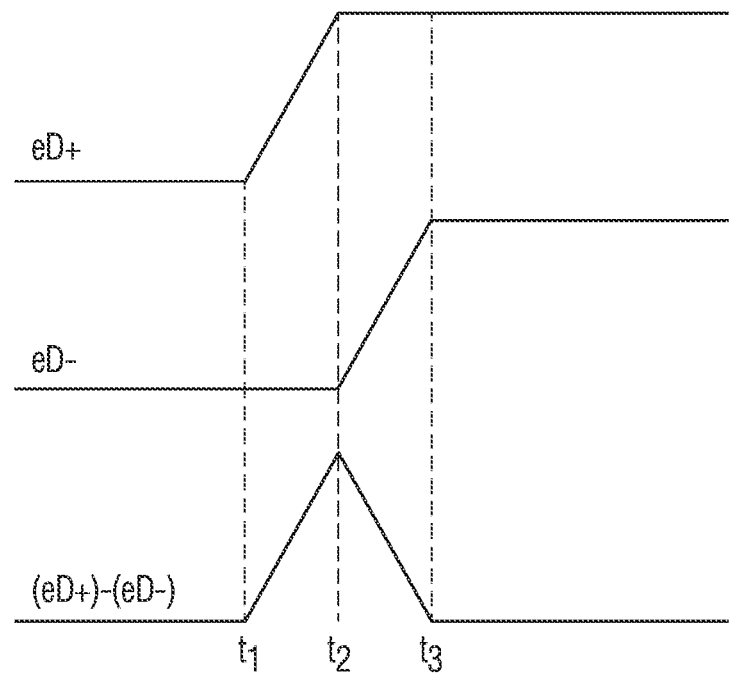
FIG. 1 illustrates the effects of a signal skew in a differential signal.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

The embedded USB2 (eUSB2) specification is a supplement to the USB2.0 specification that addresses issues related to interface controller integration with advanced system-on-chip (SoC) process nodes by enabling USB2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks.

As applications like smartphones and tablets continue to pack more and more components into smaller form factors, it is essential that interfaces shrink as well. However, the continued shrinking of SoC node size has led to a thinner gate oxide that can only support lower voltages. For devices relying on USB2.0 interfaces, this trend can lead to complicated design challenges for advanced process nodes.

When process nodes reach 7 nm, quantum effects begin impacting high-signaling-voltage inputs/outputs (IOs) such as 3.3V and can no longer be easily supported. Many device-to-device interfaces already support low signaling voltages, but USB2.0 still requires a 3.3V I/O voltage to operate.

USB2.0 has been the most successful wired interface in the past 20 years, and almost all SoCs today are equipped with the USB2.0 interface. USB standards evolution kept the original 3.3V I/O USB 1.0 interface intact for backward compatibility, helping enable wider adoption and a larger ecosystem while also preserving device interoperability.

As process nodes approach smaller features (e.g. 5 nm), the manufacturing cost to maintain USB2.0 3.3V I/O signaling has grown exponentially. eUSB2 addresses the I/O voltage gap as a physical layer supplement to the USB2.0 specification so that designers can integrate the eUSB2 interface at the device level while leveraging and reusing the USB2.0 interface at the system level.

eUSB2 can support onboard inter-device connectivity through direct connections as well as exposed connector interfaces through an eUSB2-to-USB2.0/USB2-to-eUSB2 repeater, to perform level shifting While USB2.0 can continue to be integrated into SoCs with process features of 7 nm and above, eUSB2 is a good fit for SoCs when process features are 5 nm and below. eUSB2 can also be integrated into other devices to easily interconnect with SoCs as a device-to-device interface. USB2.0 will continue serving as the standard connector interface.

eUSB2 allows significant I/O power reduction and improves power efficiency, while enabling process features to continue to scale.

The eUSB/USB2 signal has three modes: LS (Low Speed), FS (Full Speed) and HS (High Speed). At any time one of these modes is functional in a eUSB/USB2 repeater. The LS signal at the eUSB2 side of the repeater has a very sharp raising/falling time. The allowed skew between eDp (eD+) and eDm (eD−) pins (i.e., the positive and negative differential pins) is 600 ps.

The HS mode has a very fast response requirement and needs to detect the incoming signal in the nanosecond range and enable the high-speed path. A HS squelch detector may detect the LS mode signal that has some skew as a HS differential signal and as a result enables a HS path by mistake. This causes an unwanted signal on the USB2 output of the HS path which is practically noise, and this situation should be avoided.

Embodiments for skew detection are described herein that include a simple, low current, small area, and low complexity solution for a low-speed (LS) skew detector in a eUSB/USB2 repeater. Using this fast response skew detector in combination with the HS squelch detector avoids the unwanted HS noise on USB2 pins. While an eUSB/USB2 repeater is used as an example in this disclosure, other types of repeaters or circuits that require skew detection may use the skew detector embodiments described herein.

FIG. 1 illustrates the effects of a signal skew in a differential signal. The positive signal dD+ begins increasing before the negative signal eD− at time $t_1$. At time $t_2$ the negative signal eD− begins increasing, and at $t_3$ the negative signal eD− reaches its full value. The difference between eD+ and eD− is plotted as well. This plot shows a difference signal that starts increasing at $t_1$ and peaks at $t_2$, and at $t_2$ the difference signal starts decreasing until it becomes zero at time $t_3$. This difference signal that arises due skew may increase above a squelch detector threshold in the HS path of the repeater, so that the squelch detector turns on the HS path, and this difference signal due to a skew in the LS signal appears as noise on the HS channel.

This error may exhibit one of the following false conditions to the eUSB2 repeater:
1. If the rising edge of eD+ precedes the rising edge of eD−, it may initially present itself as the first bit of SYNC in LS operation;
2. If the rising edge of eD− precedes the rising edge of eD+, it may present itself as the first bit of SYNC in FS operation, or a LS keep-alive in LS operation; and
3. If either of the above two mentioned conditions occur during HS operation, it may present itself as a HS K or J USB state that may lead to HS squelch detector exiting from squelched condition.

According to the eUSB standard, it is highly recommended for an implementation to apply proper filtering mechanisms to avoid unintended action in response to those false conditions. Some possible mechanisms include, but are not limited to, the following:
1. For FS/LS operation it shall adhere to USB2.0 FS/LS hub repeater timing, with the exception of next transition jitter from eUSB2 to USB 2.0 and paired transition in both directions. The jitter to next transition follows eUSB2 parameter $Te\_to\_U\_D_{J1}$, instead of the corresponding USB 2.0 parameter $T_{HDJ1}$. $T_{HDJ1}$ still applies to USB 2.0 to eUSB2. The jitter to paired transition follows eUSB2 parameter TDJ2, instead of the corresponding USB 2.0 parameter $T_{HDJ2}$; and
2. For HS operation, reduce the squelch detector sensitivity to not respond to the short pulse, and have the SE1 detector disable the squelch detector upon declaring SE1 detection.

The eUSB standard specifies a minimum skew in the received signal of 600 ps. Further, the squelch detector detect threshold may be in the range of 60 to 110 mV. So any differential signal that exceeds the squelch threshold will cause the squelch detector to turn the HS channel on. Further, the length of this error signal can be significant, for example on the order of 6 ns.

The embodiments of skew detectors described herein provide the following benefits: addressing skew in eUSB/USB2 repeaters; providing a low complexity, low area, and low power skew detector device; providing a single source multiple level skew detector; preventing the passing of common mode noise on USB2 HS line; a fast response; negligible impact on HS path performance; and a system level and circuit level solution.

The embodiments of skew detectors described herein may be used in any place which need skew detection, especially when a high-speed low complexity implementation is needed. The embodiments described herein have been designed for eUSB signal in a eUSB/USB2 repeater, but the idea can be used in other applications.

Figure 2:
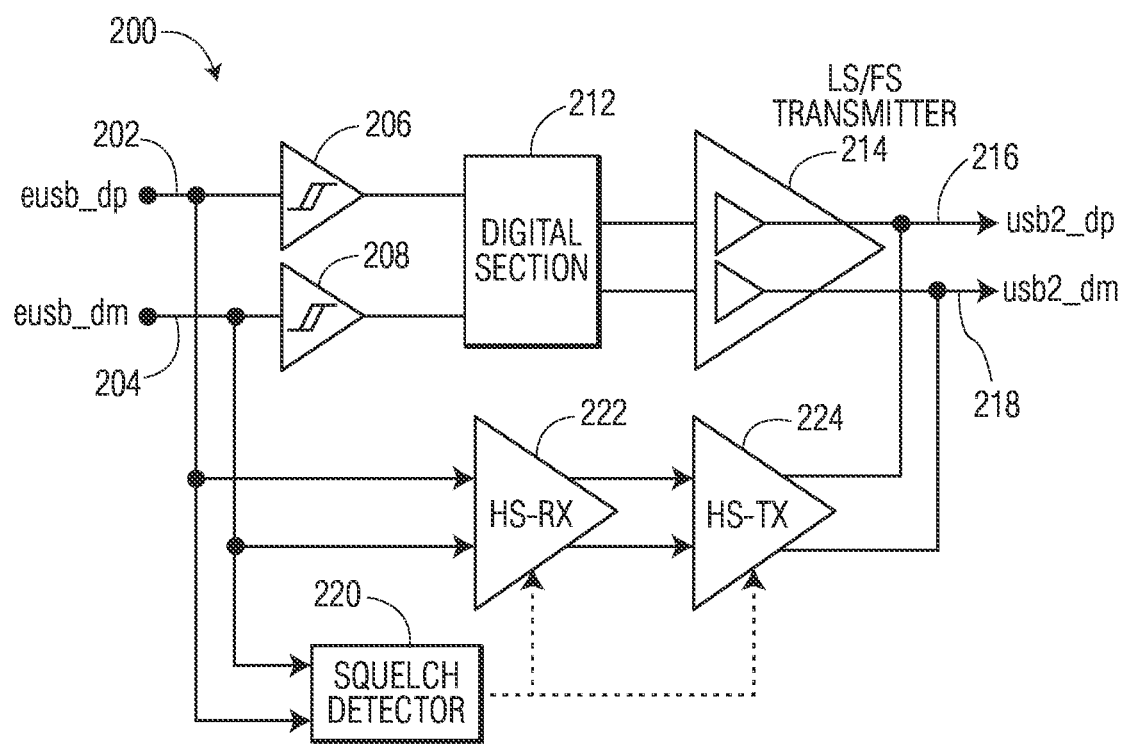
FIG. 2 illustrates a eUSB to USB2 repeater.

FIG. 2 illustrates a eUSB to USB2 repeater. The repeater 200 has differential inputs 202 and 204 and differential outputs 216 and 218. A LS/FS section includes buffers 206 and 208, a digital section 212, and a LS/FS transmitter 214. The input differential signal is received on the differential inputs 202 and 204 and input into buffers 206 and 208. The digital section receives the two differential inputs and with the help of a digital state machine determines digital value associated with the input signal and the state of the input signal. The repeater 200 also includes a high-speed (HS) section that includes a squelch detector 220, a high-speed receiver HS-RX 222 and a high-speed transmitter HS-TX 224. The HS section is fully differential that is enabled when the squelch detector 220 detects an incoming HS signal.

At any time, only one of the LS, FS or HS modes of the repeater is active and passes a signal. During the LS/FS mode, HS squelch detector 220 will not detect the high-speed differential signal and the high-speed path is off. During the HS mode, since the HS signal level is low (lower than what is to be considered as LS or FS), the LS/FS path is practically off. Due to the requirements of the HS mode (in which second unit interval (UI) of signal passed to USB2 needs to be clean), the squelch detector 220 will detect incoming HS eUSB signal in nano-seconds range (e.g. 1-2-3 ns), and the whole HS path needs to be enabled in one UI (e.g., data rate=480 Mbps). The squelch detector output directly enables the HS path. Further, the LS or FS signal will not be detected in HS mode by squelch detector 220.

The squelch detector 220 is a fast and fairly accurate circuit which should detect the incoming HS signal in the nano-seconds range. These requirements mean that the squelch detector 220 requires a high current (e.g., a couple of hundreds micro-amp range) and is a fairly complicated analog circuit.

Figure 3:
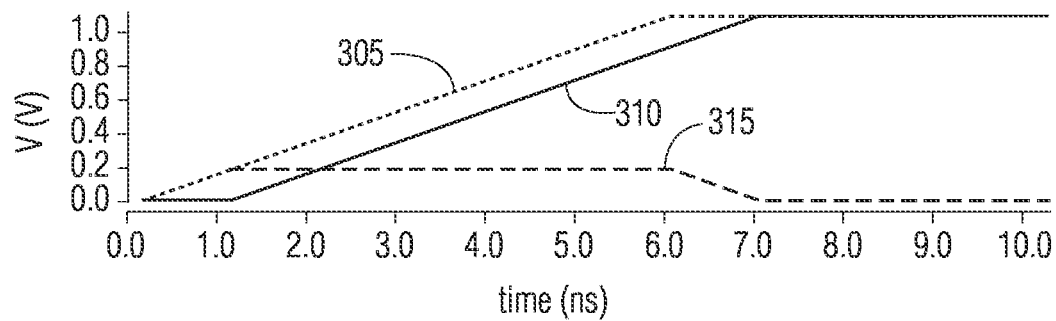
FIG. 3 illustrates a plot of the differential inputs and the difference between the signals.

As was explained above and from the eUSB standard document, due to a high rise time of the incoming LS/FS eUSB signal, if a skew between differential inputs 202 and 204 exists, the squelch detector 220 may see it as a differential signal and react quickly. FIG. 3 illustrates a plot of the differential inputs and the difference between the signals. The differential inputs 305 and 310 have a rise time of 6 ns (which is in line with a LS signal nature) and a slew of, for example, Ins of which 600 ps may be due to the PCB and 400 ps may be due to the package and die. The difference between the skewed inputs is plotted as well, which may lead to a false HS signal 315. The false HS signal 315 may last ~6 ns as shown.

Figure 4:
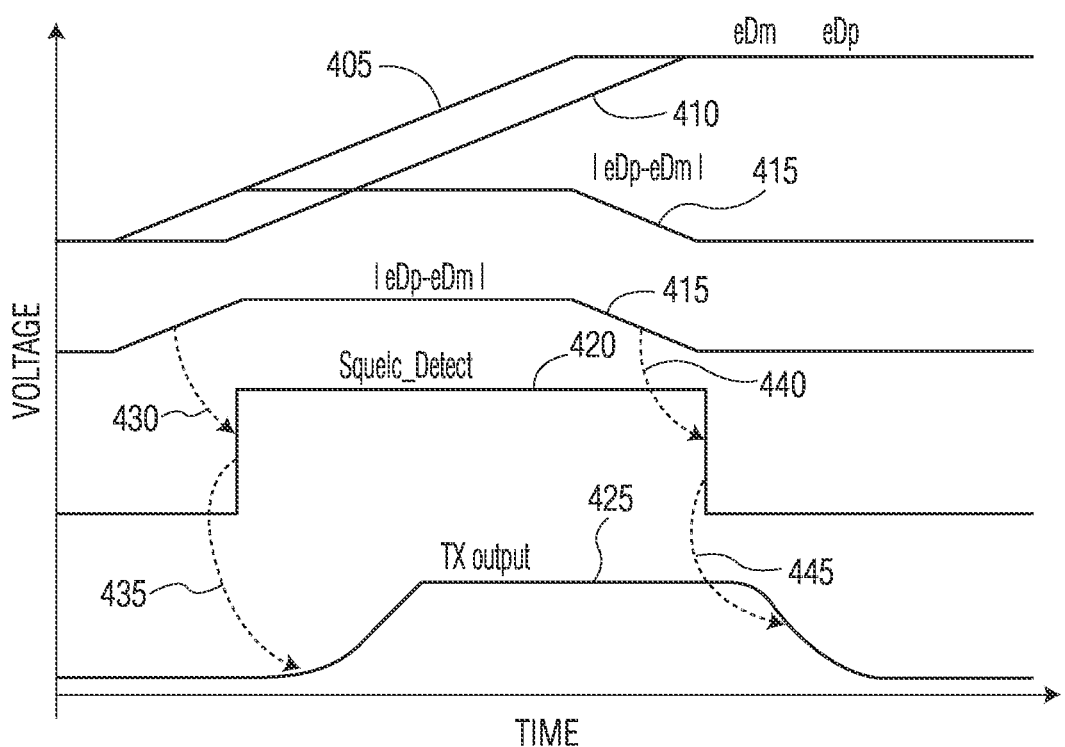
FIG. 4 illustrates the output of the HS channel when a skew is present in a LS/FS signal.

Also the whole HS path is a fast wake up path. This means that it wakes up in the nanosecond range. The incoming LS/FS signal, which wrongly has been interpreted as an incoming HS differential signal (by HS squelch detector which enable she HS path), will pass through HS channel as noise which may be treated as HS signal in the next stage. FIG. 4 illustrates the output of the HS channel when a skew is present in a LS/FS signal. In FIG. 4, a plot of the differential inputs eDm 405 and eDp 410 is shown like in FIG. 3 where there is a skew between the differential inputs. Also a plot 415 of the difference between the differential inputs |eDp−eDm| is illustrated. Once the difference between the differential inputs reaches a threshold value 430, the squelch detect signal 415 turns on. When the squelch signal enables the HS path 435, the HS channel will be enabled by HS squelch detector and passes the wrongly detected signal and signal 425 will be seen at TX output. Once the difference between the differential inputs 415 drops back below the threshold value 440, the squelch signal disables the HS path and the TX output 425 will go to zero.

One standard solution to avoid this situation is to delay the squelch detector output, in this example, for 7+ ns (the "+" is the SQ detector response time which is ~1-2 ns) to avoid false enabling the HS channel. This solution is problematic because the HS channel wakeup time should be fast in order to pass the second UI. Delaying the squelch detector response that long negates the fast response feature of the HS path.

A simple low-power low complexity skew detector in combination with the existing squelch detector is the solution described in the embodiments below. The simple skew detector should be fast and act in the 2-3 ns range, and it should be low complexity, low area, and low power. Further, the detection threshold should be slightly higher than maximum voltage of the incoming eUSB HS signal to assure that it is a skewed LS/FS signal, and not an HS signal.

Figure 5:
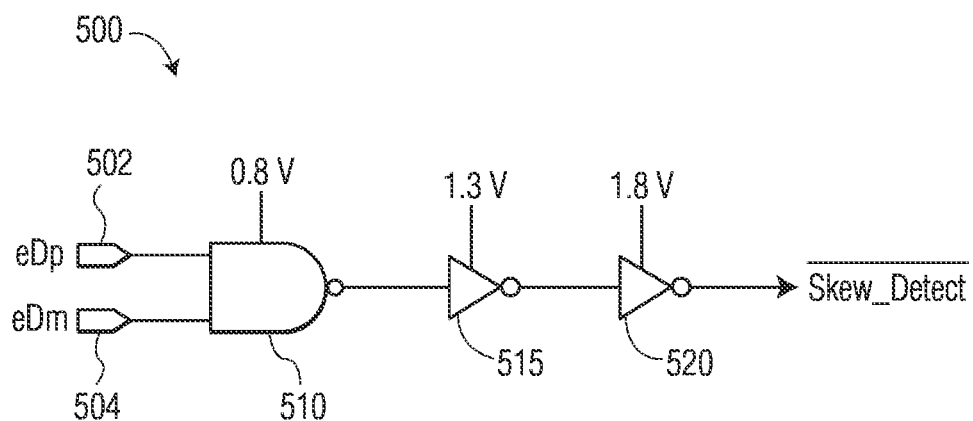
FIG. 5 illustrates an embodiment of a skew detector circuit.

A NAND gate will accomplish these purposes. In the present example, it may act at ~500 mV level, so its supply cannot be 1.8 V or 3.3 V which are the available supplies for an eUSB/USB2 bi-directional repeater (note that even a 1.2V supply would not help). FIG. 5 illustrates an embodiment of a skew detector circuit. The skew detector 500 includes a NAND gate 510, a first level shifter 515, and a second level shifter 520. The NAND gate 510 operates on a 0.8V supply and receives differential inputs eDp 502 and eDm 504. The output of the NAND gate 510 is the NAND of the received inputs, and the NAND gate will only produce a "0" output when both inputs are in logic "1" levels. When the two inputs are "0", the output is "1" and when the two inputs are "1", the output is "0". Any "skew" in two inputs causes a delay in going from "1" to "0" at the output. FIG. 5 practically generates an inverted skew detect signal.

As a fast level shifter which works in the sub nanosecond range is power hungry and adds complexity, the level shifting can be done in two levels. The implemented concept is shown in FIG. 5 using two level shifters. The first level shifter 515 uses a 1.3V power source to convert the input from a 0.8 V domain to a 1.3 V domain, and the second level shifter 520 uses a 1.8V power source to convert the input from a 1.3V domain to a 1.8V domain. The first and second level shifters 515 and 520 may therefore be simpler circuits that provide the needed speed without an impact on current consumption or area consumption.

A simple regulator may provide the needed power sources for the skew detector 500. The output signal of the skew detector needs to be lifted up to 1.8 V level to comply with the output of HS squelch detector to control the HS path. Because the HS path is in the 1.8 V and 3.3 V domain, the output of the skew detector—which in combination with the squelch detector output will be used to control the HS path—needs to be in the 1.8 V domain.

Figure 6:
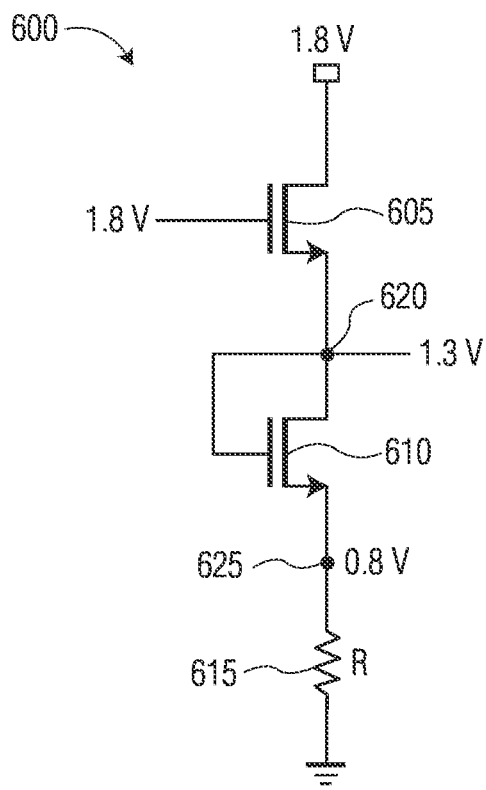
FIG. 6 illustrates a two stage regulator that produces two additional voltages used to power the level shifters in the skew detector.

FIG. 6 illustrates a two stage regulator that produces two additional voltages used to power the level shifters in the skew detector. Because 1.8V is the available source, both 0.8V source and 1.3V source may be generated from it. The regulator 600 includes a first transistor 605, second transistor 610, and resistor 615 connected in series. The first transistor 605 receives a 1.8V source voltage at its gate and drain. As a result, when the 1.8V source is present the first transistor 605 is on and a 1.3V signal is present at the source which is connected to node 620. The drain and gate of the second transistor 610 are connected to the 1.3V signal at node 620. The presence of the 1.3V signal at node 620 turns the second transistor 610 on to produce a 0.8 V signal at the source of the second transistor 610 which is connected to the node 625. A resistor 615 is connected between the second transistor 610 and ground, and the value of R is selected to be large to reduce the amount of current flowing through the resistor 615. This simple regulator 600 produces the needed 1.3V and 0.8V source voltages. The simple regulator 600 does not consume very much power or current and takes up only a small area to implement.

Figure 7:
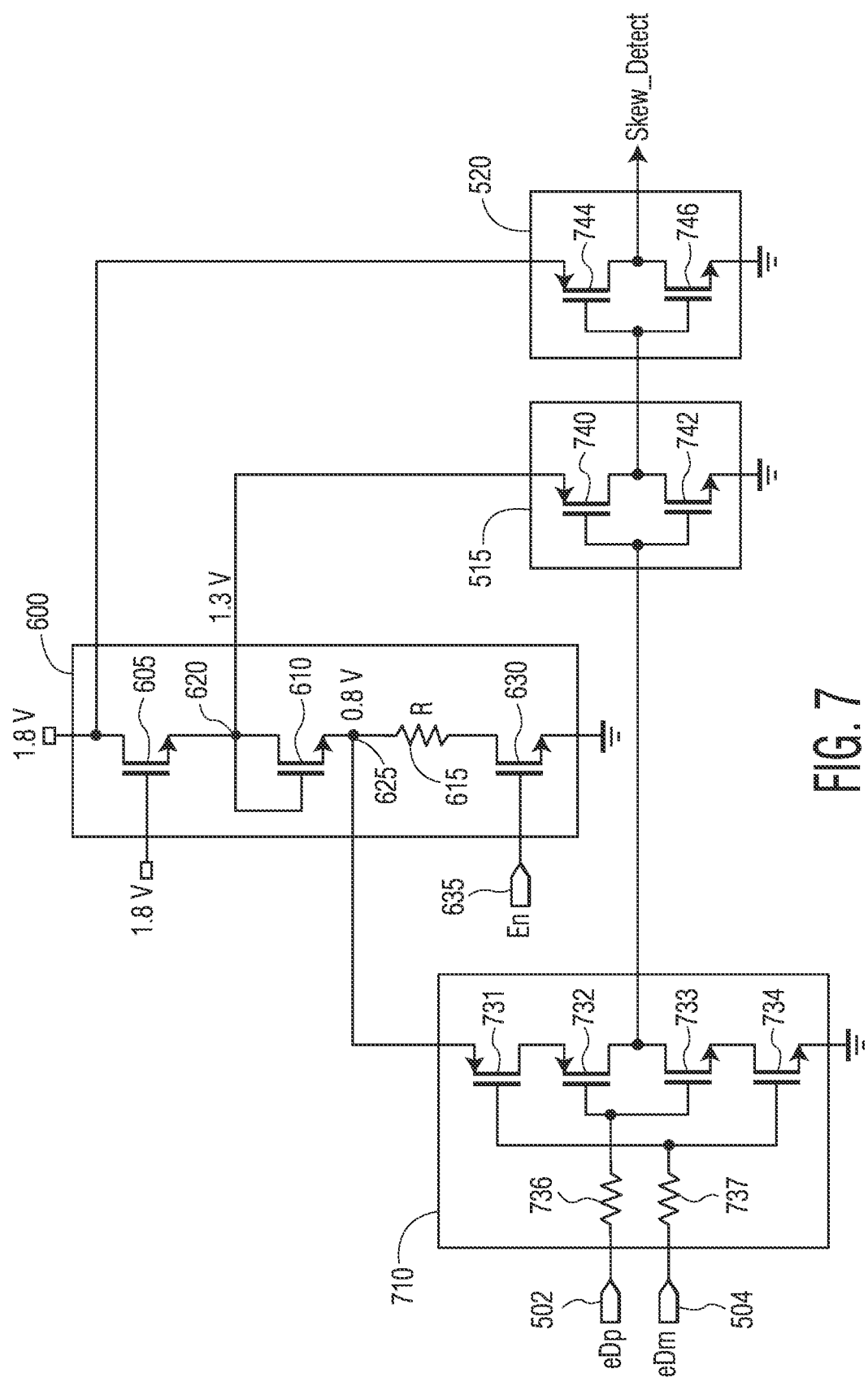
FIG. 7 illustrates a more detailed circuit implementation of the skew detector of FIG. 5.

FIG. 7 illustrates a more detailed circuit implementation of the skew detector of FIG. 5. The logic circuit 710 may be implemented by four transistors 731, 732, 733, 734 connected in series. The logic circuit 710 provides the functionality of the NAND gate 510 in FIG. 5. As will be discussed below, the logic circuit 710 does not provide the exact same response as the NAND gate 510, but it does provide the response needed for this application. Transistors 731 and 732 are PMOS transistors, and transistors 733 and 734 are NMOS transistors. The eDp input 502 is connected to the gates of transistors 732 and 733 via a resistor 736.

Likewise, the eDm input 504 is connected to the gates of transistors 731 and 734 via a resistor 737.

The regulator 600 is the same as that shown in FIG. 6 with the addition of an enable transistor 630 that turns the regulator 600 on an off based upon an enable signal 635 received at the gate of the enable transistor 630.

The first level shifter 515 may be implemented by a PMOS transistor 740 connected in series with NMOS 742 transistor. The gates of the transistors 740 and 742 are connected to the input of the level shifter, and the output of the level shifter is connected to a node between the transistors 740 and 742. The first level shifter receives a source voltage of 1.3 V to increase the level of the input signal. Likewise, the second level shifter 502 includes PMOS transistor 744 and NMOS transistor 746 and operates in the same manner as the first level shifter 515. The second level shifter receives a power source of 1.8 V.

The size of the logic circuit 710 is slightly optimized for the minimum PVT variation. The total consumed current in a functional mode is ~0.8/R which will be set around <1 µA and the dynamic current will be negligible. Response time of the skew detector is ~1-2 nS.

Figure 8A:
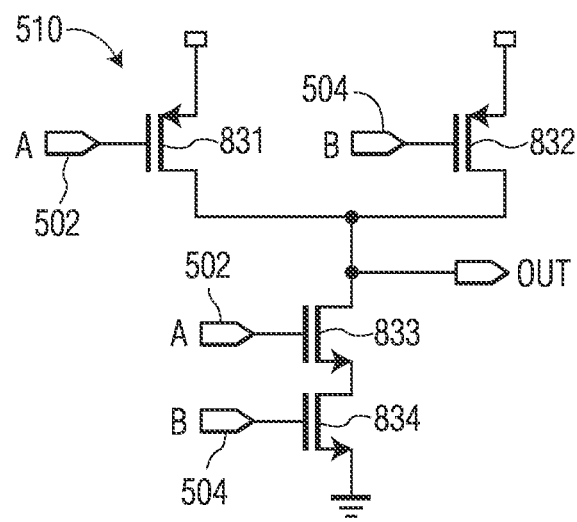
FIG. 8A illustrates a traditional implementation of a NAND gate.
Figure 8B:
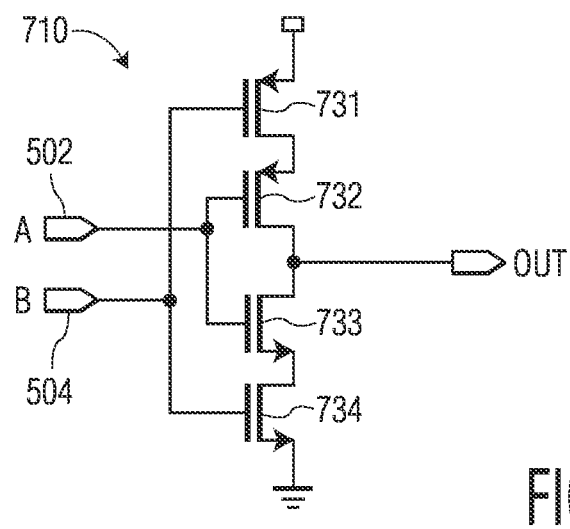
FIG. 8B illustrates the logic circuit of FIG. 7.
Figure 8C:
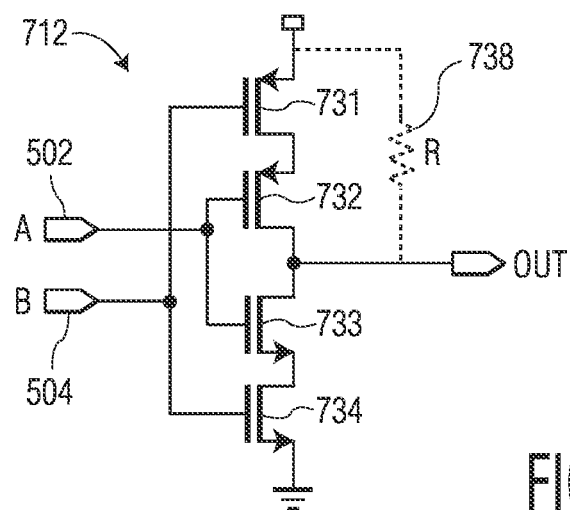
FIG. 8C illustrates the logic circuit of FIG. 7 with the addition of a resistor.

Although the NAND gate is shown in FIG. 5 to illustrate the concept, there will be slight difference between the implemented logic circuit 710 and a NAND gate 510. FIG. 8A illustrates a traditional implementation of a NAND gate. The NAND gate includes PMOS transistors 831 and 832 in parallel each receiving at their gates inputs 502 and 504, respectively. NMOS transistors 833 and 834 are connected in series and receive at their gates inputs 502 and 504, respectively. Table 1 below shows the logic table for inputs AB 502 and 504 and the output of the NAND gate. FIG. 8B illustrates the logic circuit 710 of FIG. 7. FIG. 8C illustrates the logic circuit 710 of FIG. 7 with the addition of a resistor 738.

The output of a NAND gate will be logic 1 when its two inputs, A and B are logic 0, and will be logic 0 when the two inputs are logic 1. As seen in Table 1, the output of the implemented logic circuit 710 goes from logic 1 to logic 0 when both inputs are logic 1, then stays there for the 0/1 or 1/0 combination of inputs. This is because when the inputs are logic 1, the NMOS transistors 733 and 734 turn on and PMOS transistors 731 and 732 turn off, so that the output is pulled to ground or logic 0. Likewise, the output goes to logic 1 only when both inputs are 0. This is because when the inputs are logic 0, the NMOS transistors 733 and 734 turn off and PMOS transistors 731 and 732 turn on, so that the output is pulled to the source voltage or logic 1. Alternatively, the logic circuit 712 may include a weak pull up resistor 738 at the output node of the logic, as is shown in dotted form of the logic circuit 712, and this weak pull up resistor will do the job but it is not necessary to include it. The logic circuit 712 functions as desired, but when the two inputs AB=11, a DC current from supply to ground through resistor R will be consumed which is preferably avoided. To reduce this current, R should be large which will require significant area. Also adding R to the middle node will reduce the speed. The NAND gate 510 also functions as desired, but since two transistors are connected to the output node, speed of the circuit will be decreased where speed means the overall reaction time. The logic circuit 710 is a small and fast circuit. Although it suffers from unknown states when AB="01" or "10", this does not affect the desired functionality of the logic circuit 710, but the logic circuit 710 is a fairly fast circuit and consumes no current in steady state condition.

TABLE 1

| AB | Out (NAND gate 510) | Out (Logic 710) | Out (Logic + R 712) |
|----|---------------------|-----------------|----------------------|
| 00 | 1 | 1 | 1 |
| 01 | 1 | X | 1 |
| 10 | 1 | X | 1 |
| 11 | 0 | 0 | 0 |

Figure 9:
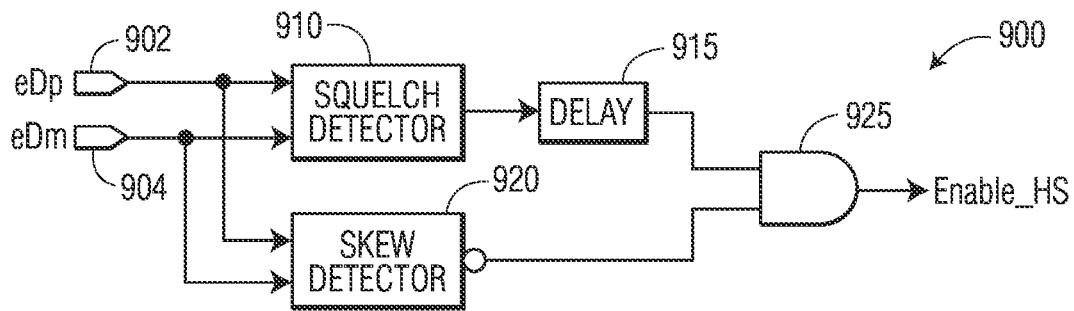
FIG. 9 illustrates a HS path enable circuit that combines the HS squelch detector and the skew detector.

FIG. 9 illustrates a HS path enable circuit that combines the HS squelch detector and the skew detector. The HS path enable circuit 900 includes squelch detector 910, delay circuit 915, skew detector 920, and AND gate 925. The skew detector 920 now can be used to allow the HS path to only be enabled when there is no skew detected. The HS enable signal will be generated by the AND gate 925 which receives the output of the skew detector 920 and a delayed inverted output of the squelch detector 910. This means that the HS path will only be enabled when the squelch detector determines that there is a HS signal present and no skew has been detected. The whole time the HS channel will stay on during this period is ~2-3 ns. Glitches with short duration will pass through the HS channel which is below the expected USB2 HS signal level.

The delay circuit 915 may introduce ~1 ns on the output of the squelch detector 910 which makes any false enable pulse very narrow. This narrow pulse may be short enough so that the HS path does not become fully enabled. The ~1 ns delayed version of output of the squelch detector 915 will impact the wake-up time of HS path for ~1 ns which is only a minimal impact which can be tolerated.

Figure 10:
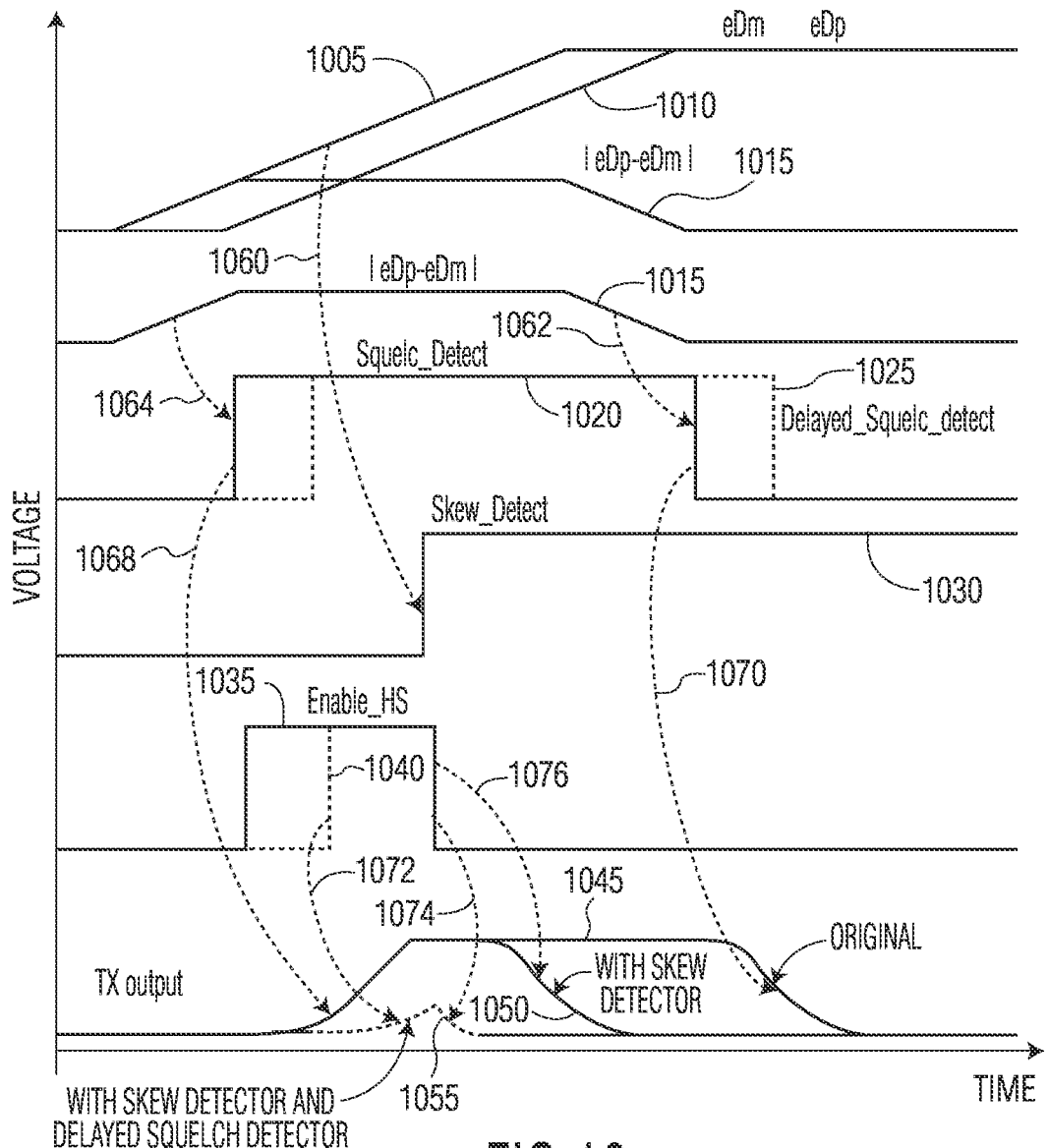
FIG. 10 illustrates plots of the eDp/eDm signals, the differential input of HS path due to skew effect of LS/FS signals, the output of the squelch detector in combination of original and delayed version of the skew detector, an Enable_HS signal, and the output of the TX driver.

FIG. 10 illustrates plots of the eDp/eDm signals, the differential input of HS path due to skew effect of LS/FS signals, output of a squelch detector in combination of original and delayed versions of the skew detector, an Enable_HS signal, and the output of the TX driver. FIG. 10 includes plots of the differential inputs 1005 and 1010 and the difference between the differential inputs 1015, and these plots are the same as found in FIG. 4 as 405, 410, and 415. Further, a plot of the squelch detector 1020 is illustrated which is the same as the plot 420 in FIG. 4. Also shown is a plot 1025 of the delayed output of the squelch detector. As the difference signal 1015 increases above a threshold level, the squelch signal transitions 1064 to a high state. Likewise, with the difference signal 1015 decreases below a threshold value, the squelch signal transitions 1066 to a low state as shown. A plot of the skew detect signal 1030 is also illustrated. The skew detect signal 1030 transitions 1060 to high when the difference signal 1015 reaches a value above a threshold value indicating the presence of skew. A plot of the enable HS signal 1035 is illustrated. The enable HS signal 1035 becomes high when the squelch detect signal 1020 becomes high while the skew detect signal 1030 remains low. Once the skew detect signal 1030 transitions to the high state 1060, the enable HS single transitions to low. In the case where the squelch signal is delayed 1025, then the enable HS signal goes high later as shown by the plot 1040. This narrows the time that the HS path is enabled.

Various plots of the TX output are illustrated for the various scenarios. First the original output of the 1045 is shown which corresponds to the plot 425 in FIG. 4. In this situation the TX output is on for a period time corresponding to the transitions in the squelch detector signal 1068 and 1070.

When the enable HS signal is used, the plot of the TX output is 1050. This shows the output being shortened versus the original plot 1045 due to the fact that the skew detector shuts down the HS path when skew is detected. The plot of the TX output when the output of squelch detector is delayed 1055 is also illustrated. In this case the increase in the TX output is delayed 1072 due to the enable HS signal 1040 being delayed due to the delay in the squelch signal 1025. Then when the enable HS signal transitions to low 1076, the TX output starts to decrease back towards zero. As a result, with the use of the skew detector and a delayed squelch signal, the output of the TX channel can be greatly reduced in magnitude and duration. This signal may be small enough so that it does not affect the next stage of the system.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A high speed path enable circuit, comprising:
   a skew detector comprising:
     a logic circuit having two inputs configured to generate a logic 1 output when the two inputs have a logic 0 value and generate a logic 0 output when the two inputs have a logic 1 value;
     a first level shifter configured to increase the output of the logic circuit to a higher voltage;
     a second level shifter configured to increase the output of the first level shifter to a higher voltage; and
     a voltage regulator configured to produce a first voltage for the logic circuit, a second voltage for the first level shifter, and a third voltage for the second level shifter;
   a squelch detector connected to the two inputs of the skew detector; and
   an AND gate configured to receive as inputs an output of the skew detector and an output of the squelch circuit and to produce a high speed path enable signal.

2. The high speed path enable of claim 1, wherein the logic circuit comprises:
   an output connected to a node;
   first and second PMOS transistors connected in series between a first voltage and the node; and
   first and second NMOS transistors connected in series between the node and ground;
   wherein a first of the two inputs is connected to the gates of the second PMOS transistor and the first NMOS transistor, and
   wherein a second of the two inputs is connected to the gates of the first PMOS transistor and the second NMOS transistor.

3. The high speed path enable circuit of claim 2, wherein the first level shifter includes a third PMOS transistor connected in series with a third NMOS transistor between the second voltage and ground, wherein the gates of the third PMOS transistor and third NMOS transistor are connected to the output of the logic circuit;

the second level shifter includes a fourth PMOS transistor connected in series with a fourth NMOS transistor between the third voltage and ground; and
the gates of the fourth PMOS transistor and fourth NMOS transistor are connected to an output of the first level shifter.

4. The high speed path enable circuit of claim 2, wherein the voltage regulator comprises:
   a first node configured to produce the first voltage and connected to a source voltage;
   a second node configured to produce the second voltage;
   a third node configured to produce the third voltage;
   a third NMOS transistor connected between the first and second nodes, wherein the gate of the third NMOS transistor is connected to the source voltage;
   a fourth NMOS transistor connected between the second and third nodes, wherein the gate of the fourth NMOS transistor is connected to the second node; and
   a resistor connected between the third node and ground.

5. The high speed path enable circuit of claim 4, wherein the voltage regulator further comprises:
   a fifth NMOS transistor connected in series with the resistor between the third node and the ground, wherein the gate of the fifth NMOS transistor is connected to an enable signal configured to turn the voltage regulator on and off.

6. The high speed path enable circuit of claim 1, further comprising a delay circuit connected between the output of the squelch detector and an input of the AND gate.

7. A repeater circuit, comprising:
   a high speed path in parallel with a low speed path connected between differential inputs and the differential outputs;
   a high speed path enable circuit configured to produce a high speed enable signal configured to control the high speed path, the high speed path enable circuit comprising:
     a skew detector comprising:
       a logic circuit having two inputs connected to the differential inputs configured to generate a logic 1 output when the two inputs have a logic 0 value and generate a logic 0 output when the two inputs have a logic 1 value;
       a first level shifter configured to increase the output of the logic circuit to a higher voltage;
       a second level shifter configured to increase the output of the first level shifter to a higher voltage; and
       a voltage regulator configured to produce a first voltage for the logic circuit, a second voltage for the first level shifter, and a third voltage for the second level shifter;
     a squelch detector with inputs connected to the differential inputs; and
     a NOR gate configured to receive as inputs an output of the skew detection detector and an output of the squelch circuit and to produce the high speed path enable signal.

8. The repeater circuit of claim 7, wherein the logic circuit comprises:
   an output connected to a node;
   first and second PMOS transistors connected in series between a first voltage and the node; and
   first and second NMOS transistors connected in series between the node and ground;

wherein a first of the two inputs is connected to the gates of the second PMOS transistor and the first NMOS transistor, and wherein a second of the two inputs is connected to the gates of the first PMOS transistor and the second NMOS transistor.

9. The repeater circuit of claim 8, wherein the first level shifter includes a third PMOS transistor connected in series with a third NMOS transistor between the second voltage and a ground, wherein the gates of the third PMOS transistor and third NMOS transistor are connected to the output of the logic circuit;

the second level shifter includes a fourth PMOS transistor connected in series with a fourth NMOS transistor between the third voltage and ground; and the gates of fourth PMOS transistor and fourth NMOS transistor are connected to an output of the first level shifter.

10. The repeater circuit of claim 8, wherein the voltage regulator comprises:

a first node configured to produce the first voltage and connected to a source voltage;

a second node configured to produce the second voltage;

a third node configured to produce the third voltage;

a third NMOS transistor connected between the first and second nodes, wherein the gate of the third NMOS transistor is connected to the source voltage;

a fourth NMOS transistor connected between the second and third nodes, wherein the gate of the fourth NMOS transistor is connected to the second node; and a resistor connected between the third node and ground.

11. The repeater circuit of claim 10, wherein the voltage regulator further comprises:

a fifth NMOS transistor connected in series with the resistor between the third node and the ground, wherein the gate of the fifth NMOS transistor is connected to an enable signal configured to turn the voltage regulator on and off.

12. The repeater circuit of claim 7, further comprising a delay circuit connected between the output of the squelch detector and an input of the AND gate.

\* \* \* \* \*